United States Patent
Seo et al.

(10) Patent No.: US 9,496,328 B2
(45) Date of Patent: Nov. 15, 2016

(54) METHODS OF MANUFACTURING CAPACITORS FOR SEMICONDUCTOR DEVICES

(71) Applicant: Samsung Electronics Co., Ltd., Suwon-si, Gyeonggi-do (KR)

(72) Inventors: Jong Bom Seo, Seoul (KR); Young Geun Park, Suwon-si (KR); Bong Hyun Kim, Incheon (KR); Sun Ho Kim, Suwon-si (KR); Hyun Jun Kim, Seoul (KR); Se Hyoung Ahn, Seoul (KR); Chang Mu An, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/682,518

(22) Filed: Apr. 9, 2015

(65) Prior Publication Data
US 2016/0043163 A1 Feb. 11, 2016

(30) Foreign Application Priority Data
Aug. 5, 2014 (KR) .................. 10-2014-0100600

(51) Int. Cl.
H01L 27/108 (2006.01)
H01L 49/02 (2006.01)
B05D 1/00 (2006.01)

(52) U.S. Cl.
CPC .............. *H01L 28/90* (2013.01); *B05D 1/60* (2013.01); *H01L 27/10814* (2013.01); *H01L 27/10852* (2013.01)

(58) Field of Classification Search
CPC ............... H01L 27/10852; H01L 28/91; H01L 28/04
USPC ............................................ 438/396
See application file for complete search history.

(56) References Cited

U.S. PATENT DOCUMENTS

| 6,707,091 B2 | 3/2004 | Aihara | |
| 7,179,705 B2 | 2/2007 | Ohashi et al. | |
| 2002/0195683 A1* | 12/2002 | Kim | H01L 21/28194 257/532 |
| 2006/0186452 A1* | 8/2006 | Nam | H01L 27/10852 257/308 |
| 2007/0066015 A1* | 3/2007 | Park | H01L 28/91 438/257 |
| 2009/0165854 A1* | 7/2009 | Yamazaki | H01L 21/76254 136/258 |
| 2010/0173494 A1* | 7/2010 | Kobrin | H01L 21/0337 438/694 |

(Continued)

FOREIGN PATENT DOCUMENTS

| KR | 1020030008992 | 1/2003 |
| KR | 100655691 | 12/2006 |

(Continued)

*Primary Examiner* — Amar Movva
*Assistant Examiner* — Omar Mojaddedi
(74) *Attorney, Agent, or Firm* — Myers Bigel, P.A.

(57) ABSTRACT

A method of manufacturing a capacitor for a semiconductor device includes forming a lower electrode, forming a dielectric layer on the lower electrode, forming a first upper electrode on the dielectric layer, adsorbing an organic silicon source onto a surface of the first upper electrode, and forming a second upper electrode on the first upper electrode onto which the organic silicon source is adsorbed. Related devices and fabrication methods are also discussed.

20 Claims, 20 Drawing Sheets

(56) References Cited

U.S. PATENT DOCUMENTS

| | | | | |
|---|---|---|---|---|
| 2011/0272784 A1* | 11/2011 | Park | ................. | H01L 28/91 |
| | | | | 257/532 |
| 2012/0049258 A1* | 3/2012 | Nakahara | .......... | H01L 21/76224 |
| | | | | 257/298 |
| 2013/0154056 A1 | 6/2013 | Tonari | | |
| 2013/0164907 A1* | 6/2013 | Lee | ................. | H01L 21/36 |
| | | | | 438/400 |

FOREIGN PATENT DOCUMENTS

| KR | 1020070009285 | 1/2007 |
|---|---|---|
| KR | 1020070025007 | 3/2007 |
| KR | 1020070064014 | 6/2007 |
| KR | 101094951 | 12/2011 |

* cited by examiner

METHODS OF MANUFACTURING CAPACITORS FOR SEMICONDUCTOR DEVICES

CROSS-REFERENCE TO RELATED APPLICATION

This application claims priority to Korean Patent Application No. 10-2014-0100600 filed on Aug. 5, 2014, with the Korean Intellectual Property Office, the disclosure of which is incorporated herein by reference.

BACKGROUND

The present inventive concepts relate to methods of manufacturing capacitors for a semiconductor device.

Developments in the electronics industry, as well as in the area of information technology, have lead to the development of highly integrated and high-performance semiconductor devices used in computers and mobile devices. In semiconductor devices, an area that may be available for mounting capacitors may be decreased as a degree of integration of the semiconductor devices increases; however, maintaining or increasing a capacitance for the semiconductor devices may nevertheless be necessary. More recently, a metal-insulator-metal (MIM) capacitor, in which a high dielectric material is used as a dielectric layer, while a metal is used to form a lower electrode and an upper electrode, has been developed.

SUMMARY

Some embodiments of the present inventive concepts may provide a method of manufacturing a capacitor for a semiconductor device for forming a uniform and reproducible thickness of a silicon germanium (SiGe) layer forming an upper electrode in a metal-insulator-metal (MIM) capacitor structure.

According to some embodiments of the present inventive concepts, a method of fabricating a metal-insulator-metal (MIM) capacitor includes forming a capacitor lower electrode on a substrate, forming a capacitor dielectric layer on the lower electrode, and forming a multi-layer capacitor upper electrode on the dielectric layer opposite the capacitor lower electrode. The multi-layer capacitor upper electrode includes first and second electrode layers and an organic silicon layer therebetween.

In some embodiments, forming the multi-layer capacitor upper electrode may include adsorbing an organic silicon source onto a surface of the first electrode layer to define the organic silicon layer thereon, and then forming the second electrode layer on the organic silicon layer.

In some embodiments, the surface of first electrode layer may include portions that are hydrophobic prior to adsorbing the organic silicon source. The portions may be rendered hydrophilic responsive to adsorbing the organic silicon source.

In some embodiments, the second electrode layer may include a silicon germanium layer having a thickness that is substantially uniform independent of a delay time between forming the first electrode layer the forming of the second electrode layer thereafter.

In some embodiments, the second electrode layer may be formed using an inorganic silicon source and/or the organic silicon source, at a temperature that is insufficient to crystallize the capacitor dielectric layer.

In some embodiments, the organic silicon source may be an aminosilane-based compound, and the inorganic silicon source may be a silane-based compound.

In some embodiments, the capacitor lower electrode may be formed in electrical contact with an impurity region of a transistor on the substrate.

According to further embodiments of the present inventive concepts, a method of manufacturing a capacitor for a semiconductor device may include: forming a lower electrode; forming a dielectric layer on the lower electrode; forming a first upper electrode on the dielectric layer; adsorbing an organic silicon source (OSS) onto a surface of the first upper electrode; and forming a second upper electrode on the first upper electrode onto which the organic silicon source OSS is adsorbed.

In some embodiments, the adsorbing of the organic silicon source OSS may be performed by using a pre-flow process.

In some embodiments, the organic silicon source OSS may be an aminosilane-based compound.

In some embodiments, the aminosilane-based compound may be any one of diethylaminosilane (DEAS), diisopropylaminosilane (DIPAS), bis-diethylaminosilane (BDEAS), bis-isopropylaminosilane (BIPAS), bis-ethylmethylaminosilane (BEMAS), tris-dimethylaminosilane (TDMAS), or tris-isopropylaminosilane (TIPAS).

In some embodiments, the surface of the first upper electrode may be modified to have hydrophilicity by the adsorbing of the organic silicon source OSS.

In some embodiments, prior to the adsorbing of the OSS, oxygen atoms may be bonded onto at least a portion of the surface of the first upper electrode.

In some embodiments, the forming of the second upper electrode may include forming a silicon germanium (SiGe) layer doped with impurities.

In some embodiments, the SiGe layer may be formed using an inorganic silicon source.

In some embodiments, the SiGe layer may be formed using an organic silicon source OSS.

In some embodiments, the forming of the SiGe layer may include forming a lower SiGe layer using an organic silicon source OSS; and forming an upper SiGe layer using an inorganic silicon source.

In some embodiments, the adsorbing of the organic silicon source OSS and the forming of the second upper electrode may be performed in-situ within a batch-type deposition apparatus.

In some embodiments, the impurities may include boron (B) or phosphorus (P).

In some embodiments, the first upper electrode may include any one of titanium nitride (TiN), titanium aluminum nitride (TiAlN), or tantalum nitride (TaN).

In some embodiments, the lower electrode may be provided in a cylindrical form.

According to still further embodiments of the present inventive concepts, a method of manufacturing a capacitor for a semiconductor device may include: providing a semiconductor substrate on which at least one transistor is formed; forming a lower electrode provided in a cylindrical form on the semiconductor substrate; forming a dielectric layer on the lower electrode; forming a first upper electrode on the dielectric layer; adsorbing an aminosilane-based silicon source onto the first upper electrode; and forming a second upper electrode on the first upper electrode.

BRIEF DESCRIPTION OF THE DRAWINGS

The above and other aspects, features and advantages of the present inventive concepts will be more clearly understood from the following detailed description taken in conjunction with the accompanying drawings, in which.

DETAILED DESCRIPTION

Figure 1:
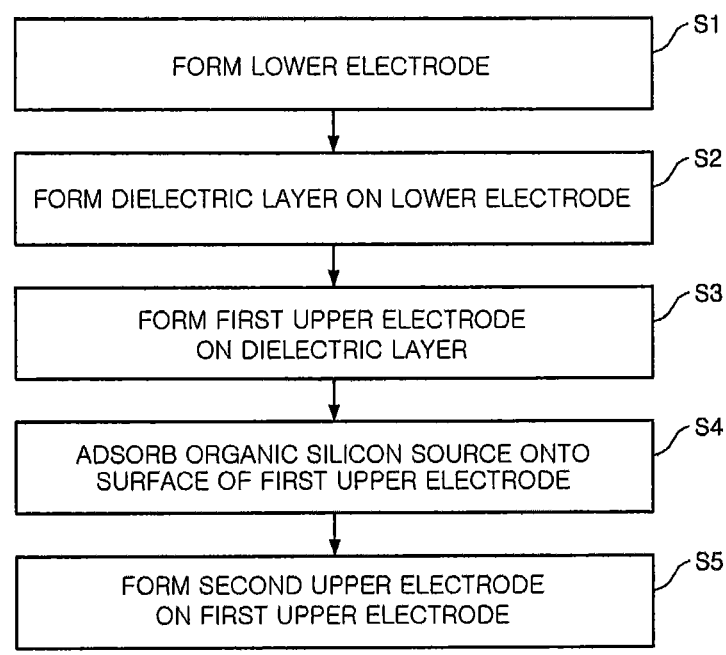
FIG. 1 is a flowchart illustrating methods of manufacturing a capacitor for semiconductor devices according to some embodiments of the present inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
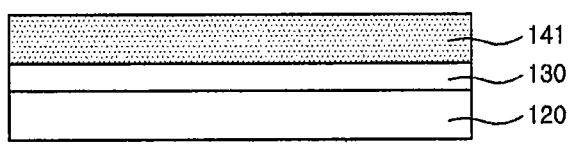
FIGS. 2 through 4 are cross-sectional views illustrating methods of manufacturing a capacitor for semiconductor devices according to some embodiments of the present inventive concepts.
Figure 3:
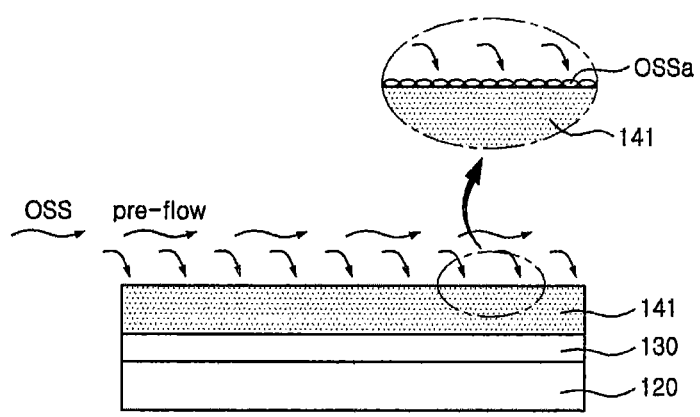
Figure 4:
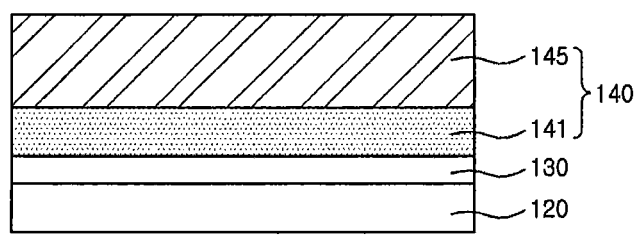

FIG. 1 is a flowchart illustrating methods of manufacturing capacitors for semiconductor devices according to some embodiments of the present inventive concepts. FIGS. 2 through 4 are cross-sectional views illustrating methods of manufacturing capacitors for semiconductor devices according to some embodiments of the present inventive concepts.

Referring to FIGS. 1 and 2, a lower electrode 120, a dielectric layer 130, and a first upper electrode 141 may be sequentially formed in operations S1, S2, and S3, respectively. For example, the lower electrode 120, the dielectric layer 130, and the first upper electrode 141 may be formed on a substrate. In operation S1, the lower electrode 120 may be formed by depositing a conductive material on the substrate. For example, the conductive material may include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), and/or combinations thereof. According to example embodiments of the present inventive concepts, the lower electrode 120 may include TiN. The lower electrode 120 may be formed by using a chemical vapor deposition (CVD) process and/or an atomic layer deposition (ALD) process. Although illustrated as a planar-type electrode in FIG. 2, the lower electrode 120 may be provided as various types of electrodes, such as a stack-type electrode, a pillar-type electrode, a cylindrical-type electrode, or the like.

In operation S2, the dielectric layer 130 may be formed on a surface of the lower electrode 120. The dielectric layer 130 may include a silicon oxide, a silicon nitride, silicon oxide/silicon nitride, silicon oxide/silicon nitride/silicon oxide, and/or a high dielectric material having a dielectric constant higher than a silicon oxide. For example, the high dielectric material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), strontium titanium oxide ($SrTiO_3$), and/or the like. The dielectric layer 130 may include two or more layers formed of different materials among the aforementioned high dielectric materials. For example, the dielectric layer 130 may be formed of $Ta_2O_5/Nb_2O_5$, $ZrO_2/Al_2O_3/ZrO_2$, $HfO_2/Al_2O_3/HfO_2$, or the like. According to example embodiments of the present inventive concepts, the dielectric layer 130 may be formed of $ZrO_2/Al_2O_3/ZrO_2$ having a low leakage current density and a sufficiently low equivalent oxide thickness (EOT). The dielectric layer 130 may be formed by using a CVD process and/or an ALD process.

Subsequently to the forming of the dielectric layer 130, the first upper electrode 141 may be formed by depositing a conductive material on a surface of the dielectric layer 130 in operation S3. The first upper electrode 141 may be formed of the same material as the conductive material used in forming the lower electrode 120. For example, the first upper electrode 141 may include Ti, TiN, Ta, TaN, TiAlN, W, WN, Ru, $RuO_2$, Ir, $IrO_2$, Pt, and/or combinations thereof. According to example embodiments of the present inventive concepts, the first upper electrode 141 may be formed of TiN. The first upper electrode 141 may be formed by using a low pressure chemical vapor deposition (LPCVD) process, a plasma enhanced chemical vapor deposition (PECVD) process, and/or an ALD process.

Referring to FIGS. 1 and 3, in operation S4, an organic silicon source (OSS) may be adsorbed onto a surface of the first upper electrode 141 by pre-flowing the OSS onto the first upper electrode 141. As illustrated in an enlarged portion of the view of FIG. 3, the adsorbed organic silicon source OSSa may form an organic silicon monolayer on the surface of the first upper electrode 141. However, the adsorbed organic silicon source OSSa is not limited to a monolayer, and may form an organic silicon multilayer on the entirety or on a portion of the surface of the first upper electrode 141 in some embodiments. The pre-flow process of the OSS may be performed within a batch-type deposition apparatus, for example, an LPCVD apparatus.

The OSS may be adsorbed onto the surface of the first upper electrode 141 to allow the surface of the first upper electrode 141 to be hydrophilic. Thus, heterogeneous nucleation may be enhanced considerably in a subsequent forming of a second upper electrode. As a result, the second upper electrode having a relatively high density and a uniform thickness may be formed.

In detail, according to example embodiments of the present inventive concepts, when a TiN layer is used to form the first upper electrode 141, a native oxide layer may be formed on a surface of the TiN layer by exposure to air. The native oxide layer formed on the surface of the TiN layer may modify the surface of the TiN layer from being hydrophilic to hydrophobic. As a period of delay time from the formation of the first upper electrode 141 using the TiN layer to that of the second upper electrode increases, namely, as a period of air exposure is prolonged, an area of the native oxide layer that is formed on the surface of the TiN layer may increase correspondingly. Accordingly, the longer delay time may lead to a gradual increase in a hydrophobic area on the surface of the first upper electrode 141 formed using the TiN layer. Although nucleation may rarely occur in the hydrophobic area due to a high level of activation energy required for nucleation, a hydrophilic surface may be obtained by adsorbing an OSS, independent or irrespective of a delay time; therefore, a state of a surface that enhance nucleation for forming the second upper electrode may be obtained.

The OSS may be an aminosilane-based compound, for example, any of diethylaminosilane (DEAS), diisopropylaminosilane (DIPAS), bis-diethylaminosilane (BDEAS), bis-isopropylaminosilane (BIPAS), bis-ethylmethylaminosilane (BEMAS), tris-dimethylaminosilane (TDMAS), tris-isopropylaminosilane (TIPAS), and/or the like. According to example embodiments of the present inventive concepts, DIPAS may be used as the OSS.

Referring to FIGS. 1 and 4, in operation S5, a second upper electrode 145 may be formed on the first upper electrode 141 onto which the OSS is adsorbed. Consequently, a capacitor including the lower electrode 120, the dielectric layer 130, and an upper electrode 140 having the first and second upper electrodes 141 and 145 may be formed.

The forming of the second upper electrode 145 may include forming a doped silicon germanium (SiGe) layer. As an example, the doped SiGe layer may be formed on the first upper electrode 141 onto which the OSS is adsorbed, by performing an LPCVD process using a silicon source gas, a germanium source gas, and an impurity source gas in-situ within a batch-type deposition apparatus, such as an LPCVD apparatus. As an alternative, the SiGe layer may be doped by using an ion implantation process undertaken subsequently to forming of the SiGe layer, rather than doping the SiGe layer using the impurity source gas. The SiGe layer may be doped using p-type impurities or n-type impurities.

The SiGe layer may be formed using an inorganic silicon source. For example, the inorganic silicon source may be any one of silane ($SiH_4$), monochlorosilane ($SiH_3Cl$), dichlorosilane ($SiH_2Cl2$), trichlorosilane ($SiHCl_3$), or silicon tetrachloride ($SiCl_4$). Alternatively, two or more inorganic silicon sources may be combined as necessary. For example, germane ($GeH_4$), digermane ($Ge_2H_6$), monochlorogermane ($GeH_3Cl$), dichlorogermane ($GeH_2Cl_2$), trichlorogermane ($GeHCl_3$), tetrakis (dimethylamino) germane ($Ge(N(CH_3)_2)_4$), and/or combinations thereof may be used as the germanium source gas. A BCl$_3$ gas, a B$_2$H$_6$ gas, or the like, may be used as the p-type impurity gas. A phosphine (PH$_3$) gas, a phosphorous trifluoride (PF$_3$) gas, an arsine (AsH$_3$) gas, and/or the like, may be used as the n-type impurity gas.

Figure 5A:
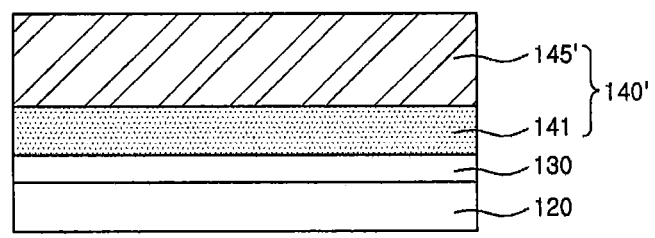
FIGS. 5A and 5B are cross-sectional views illustrating capacitors for semiconductor devices according to example embodiments of the present disclosure.
Figure 5B:
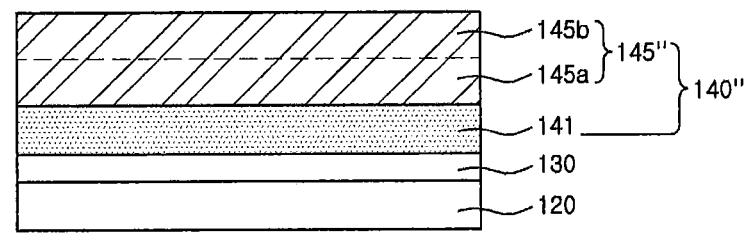

FIGS. 5A and 5B are cross-sectional views illustrating capacitors for semiconductor devices according to further example embodiments of the present inventive concepts.

FIG. 5A illustrates a capacitor for semiconductor devices including a second upper electrode 145' formed as a SiGe layer formed using the aforementioned OSS that may be usable in the pre-flow process on the first upper electrode 141 onto which the OSS is adsorbed. According to example embodiments of the present inventive concepts, DIPAS may be used as the OSS.

FIG. 5B illustrates a capacitor for semiconductor devices including a second upper electrode 145" having a lower SiGe layer 145a formed using the aforementioned OSS on the first upper electrode 141 onto which the OSS is adsorbed and an upper SiGe layer 145b formed using the aforementioned inorganic silicon source.

Figure 6:
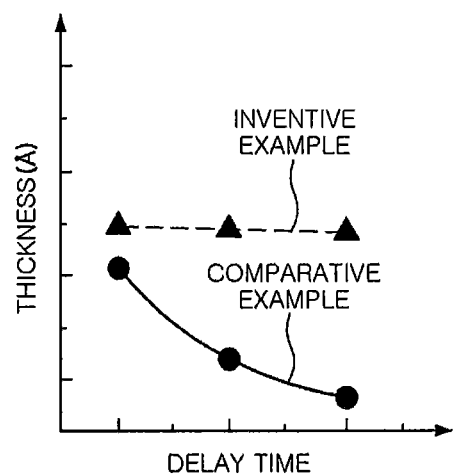
FIG. 6 is a graph illustrating changes in deposition properties of a second upper electrode according to some embodiments of the present inventive concepts.

FIG. 6 is a graph illustrating changes in deposition properties of a second upper electrode according to some embodiments of the present inventive concepts. In FIG. 6, according to an inventive example, an OSS, for example, DIPAS, may be adsorbed onto a surface of a first upper electrode, and a SiGe layer may be formed during a predetermined period of time. According to a comparative example in FIG. 6, a SiH$_4$ source, in lieu of the OSS, may be adsorbed onto the surface of the first upper electrode, and a SiGe layer may be formed during the same period of time as in the inventive example. As illustrated in the comparative example, as a period of delay time from the formation of the first upper electrode using a TiN layer to that of the second upper electrode increases, a thickness of the SiGe layer may be decreased. However, in the inventive example, a decrease in the thickness of the SiGe layer may be minimal or otherwise reduced. As such, the thickness of the SiGe layer may be substantially uniform.

The reasons for the above advantages are set forth in greater detail. As the period of delay time increases, an area rendered or modified to be hydrophobic by a native oxide layer formed on the surface of the first upper electrode may increase correspondingly. In the comparative example, SiH$_4$ may be locally adsorbed onto the surface of the first upper electrode. On the other hand, in the inventive example, DIPAS may be adsorbed onto up to the entirety of the surface of the first upper electrode. As a result, in the inventive example, the surface of the first upper electrode may be modified to be hydrophilic, and a stable hydrophilic state of the surface may be maintained, independent or irrespective of the delay time in forming the SiGe layer for the second upper electrode.

Further, since nucleation may rarely occur in the hydrophobic area due to a high level of activation energy required for nucleation, a period of incubation time from nucleation to formation of a continuous film may increase as the hydrophobic area increases. As the incubation time increases, the thickness of the SiGe layer to be formed during a predetermined period of time may be decreased.

As described above with reference to FIG. 6, according to example embodiments of the present inventive concepts, a change in the thickness of the SiGe layer to be formed on the first upper electrode according to the delay time may be considerably reduced. Therefore, a thickness distribution between batches and a thickness distribution within a single wafer may be reduced. Accordingly, a total thickness distribution including the thickness distribution between the batches and the thickness distribution within the wafer may be reduced (for example, to about a quarter, that is, from about 800 angstrom (Å) to about 200 Å). In addition, a resistance distribution of the SiGe layer may be reduced (for example, to about a half).

Such reductions in the thickness distribution of the SiGe layer may increase productivity of the semiconductor device including the capacitors by reducing process defects, for example, short-circuits between a lower electrode and a metal contact plug formed on an upper electrode, which may occur due to a large thickness distribution of a SiGe layer constituting an upper electrode, and by guaranteeing or increasing the likelihood of a reproducible SiGe layer having a uniform thickness by using a batch-type deposition apparatus, such as an LPCVD.

FIGS. 7 through 13 are cross-sectional views illustrating methods of manufacturing semiconductor devices according to some embodiments of the present inventive concepts, more particularly, methods of manufacturing semiconductor devices having cylindrical-type capacitor structures.

Figure 7:
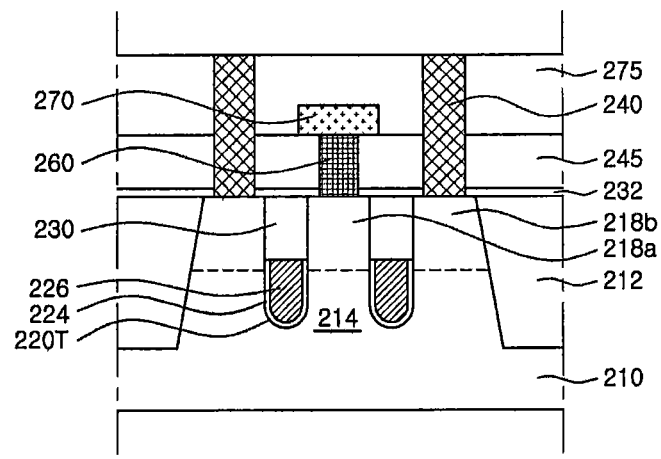
FIGS. 7 through 13 are cross-sectional views illustrating methods of manufacturing semiconductor devices according to some embodiments of the present inventive concepts.

FIG. 7 is a cross-sectional view illustrating formation of a transistor and a bit line of a semiconductor device. Referring to FIG. 7, an active area 214 may be defined by forming a device isolation layer 212 on a semiconductor substrate 210 by performing a shallow trench isolation (STI) process. The semiconductor substrate 210 may include for example, silicon, silicon-germanium, and/or the like, and may include an epitaxial layer, a silicon on insulator (SOI) layer, a germanium on insulator (GOI) layer, and/or the like. The semiconductor substrate 210 may include a first conductivity type impurities, for example, p-type impurities such as boron (B). The device isolation layer 212 may be formed of an insulating material, for example, an oxide, a nitride, and/or combinations thereof.

A pair of adjacent trenches 220T may be formed in the active area 214, and gate insulating layers 224 and word-lines 226 may be sequentially formed in the trenches 220T. The gate insulating layers 224 and the word-lines 226 may be recessed by using an etch-back process, and a top surface of the recessed word-lines 226 may be lower than a top surface of the active area 214. Each active area 214 may be provided with a pair of word-lines 226 extending in parallel in a single direction. The word-lines 226 may a doped polysilicon, a metal silicide, a metal, and/or a metal nitride. For example, the word-lines 226 may be formed of TiN.

The gate insulating layers 224 may be formed of an oxide, a nitride, and/or an oxynitride. For example, the gate insulating layers 224 may include a silicon oxide layer or an insulating layer having a dielectric constant higher than a silicon oxide layer. By way of example, the gate insulating layers 224 may include HfO$_2$, ZrO$_2$, Ta$_2$O$_5$, yttrium oxide (Y$_2$O$_3$), Nb$_2$O$_5$, Al$_2$O$_3$, TiO$_2$, cerium oxide (CeO$_2$), indium oxide (In$_2$O$_3$), lanthanum oxide (La$_2$O$_3$), and/or the like.

Capping layers 230 may be formed on the word-lines 226. The capping layers 230 may include an insulating material, for example, a silicon oxide layer, a silicon oxynitride layer, and/or a silicon nitride layer.

Subsequently to the forming of the capping layers 230, a first impurity area 218a and a second impurity area 218b may be formed in the active area 214 by using an ion implantation process. According to some embodiments, the impurity areas 218a and 218b may be formed in advance in the active area 214 by using the ion implantation process, prior to the forming of the trenches 220T. As indicated by a dashed line in FIG. 8, the first and second impurity areas 218a and 218b may extend from the top surface of the active area 214 into a predetermined depth of the semiconductor substrate 210.

According to example embodiments of the present inventive concepts, a buried channel array transistor (BCAT) including the buried word-lines 226 is illustrated; however, the type of transistor is not limited thereto. For example, the transistor may be any of a planar transistor, a recess channel array transistor (RCAT), or a sphere-shaped recess channel array transistor (SRCAT).

A first etch stop layer 232 and a first inter-metal dielectric layer 245 may be sequentially formed on the semiconductor substrate 210. A bit line contact 260 that penetrates through the first etch stop layer 232 and the first inter-metal dielectric layer 245 may be formed, for each active area 214, to contact the first impurity area 218a between the pair of recessed word-lines 226.

A bit line 270 may be formed on the first inter-metal dielectric layer 245 to allow at least a portion of the bit line 270 to contact the bit line contact 260. The bit line 270 may be disposed to extend in a direction perpendicular with respect to the direction in which the word-lines 226 extend. The bit line 270 may be electrically connected to the impurity area 218a in the active area 214 through the bit line contact 260. The bit line contact 260 may include a metal silicide, a doped polysilicon, a metal nitride, and/or a metal. The bit line 270 may include a metal and/or a metal compound.

A second inter-metal dielectric layer 275 may be formed over up to the entire surface of the semiconductor substrate 210 to cover the bit line 270 and the first inter-metal dielectric layer 245. The second inter-metal dielectric layer 275 may be planarized by performing a chemical mechanical polishing (CMP) process.

Storage node contacts 240 may be provided to penetrate through the first and second inter-metal dielectric layers 245 and 275. The storage node contacts 240 may contact the second impurity area 218b between the word-lines 226 and the device isolation layer 212.

Figure 8:
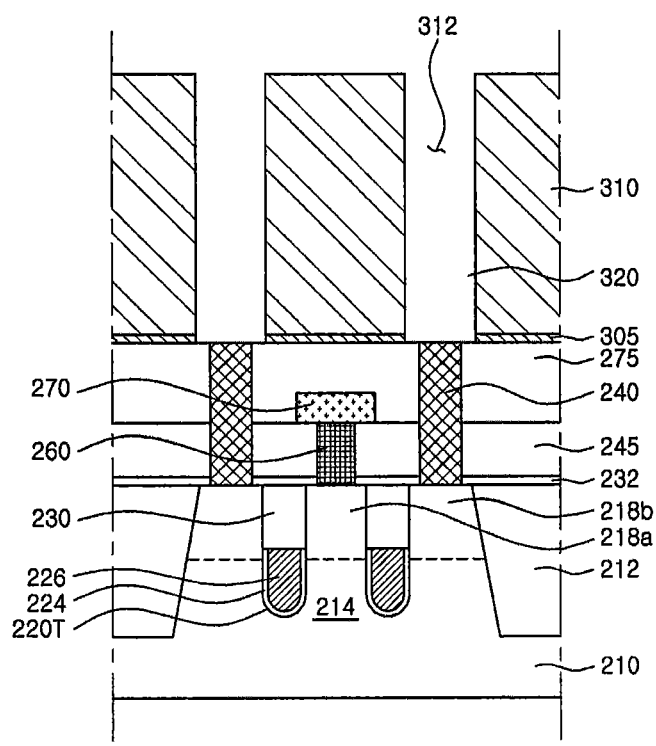

FIG. 8 is a cross-sectional view illustrating formation of an etch stop layer and a mold layer including an opening. Referring to FIG. 8, a second etch stop layer 305 may be formed on the storage node contacts 240 and the second inter-metal dielectric layer 275. A mold layer 310 may be formed on the second etch stop layer 305 by depositing an oxide.

The second etch stop layer 305 may be formed of a nitride or a metal oxide having a low etching rate, relative to the mold layer 310 formed thereon. The mold layer 310 may be formed by coating an oxide, for example, boro-phospho slilicate glass (BPSG), phospho slilicate glass (PSG), undoped silica glass (USG), spin on glass (SOG), plasma enhanced tetraethylorthosilicate (PETEOS), and/or the like. A thickness of the mold layer 310 may be adjusted, based on a capacitance required for a capacitor.

Openings exposing a surface of the second etch stop layer 305 may be formed in the mold layer 310 by anisotropically etching the mold layer 310, for example, using a photolithographic process and an etching process. Also, openings 312 exposing the storage node contacts 240 may be formed by using the etching process for selectively removing portions of the second etch stop layer 305 exposed by the openings. The openings 312 may be provided in a cylindrical shape or form, having a high aspect ratio.

Figure 9:
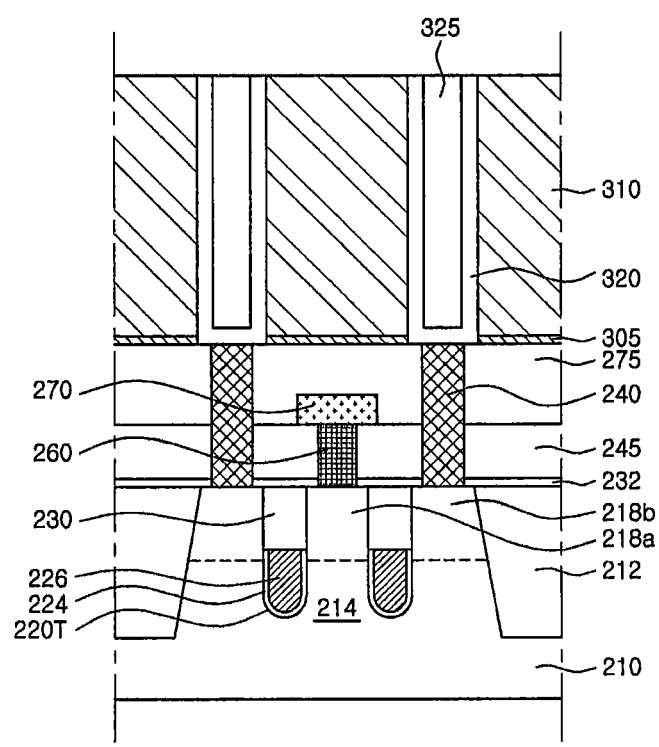

FIG. 9 is a cross-sectional view illustrating formation of a lower electrode and storage node isolation. Referring to FIG. 9, a lower electrode 320 having a predetermined thickness may be continuously formed on an inner wall of the openings 312 and a top surface of the mold layer 310. The lower electrode 320 may physically contact and cover the storage node contacts 240, thus being electrically connected thereto. The lower electrode 320 may include Ti, TiN, Ta, TaN, W, WN, Ru, $RuO_2$, Ir, $IrO_2$, Pt, and/or combinations thereof.

A sacrificial layer 325 may be formed in and/or burying the openings 312 on which the lower electrode 320 is formed. For example, the sacrificial layer 325 may be formed by depositing an oxide or by coating a photoresist. A storage node isolation process may be performed on the lower electrode 320. The lower electrodes 320 (also referred to as storage nodes) having a cylindrical shape may be formed by performing a CMP process until the top surface of the mold layer 310 is exposed. Accordingly, respective top surfaces of the mold layer 310, the lower electrode 320, and the sacrificial layer 325 may be coplanar or exposed to a common plane. The sacrificial layer 325 may remain in the openings 312.

Figure 10:
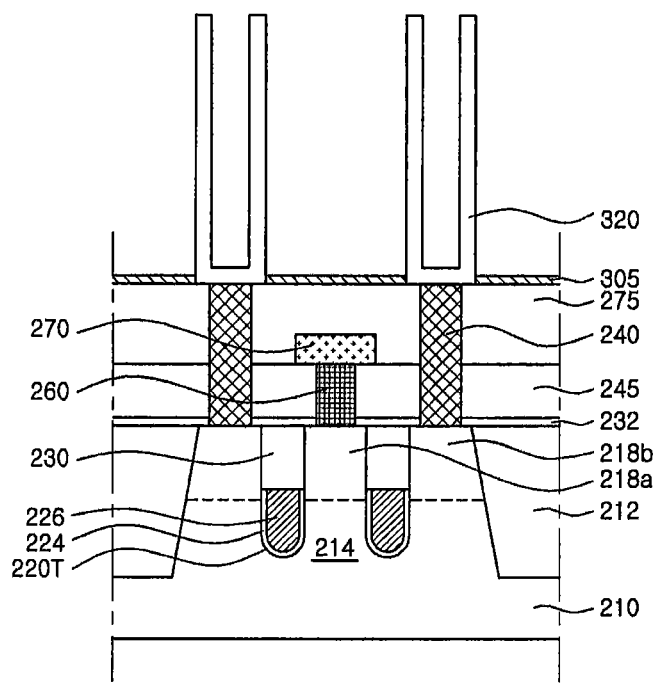

Referring to FIG. 10, the lower electrode 320 may be exposed by removing the mold layer 310 and the sacrificial layer 325. The process of removing the mold layer 310 and the sacrificial layer 325 may be performed by an ashing/stripping process, an isotropic etching process, and/or combinations thereof. As a result, the lower electrode 320 (also referred to as a storage node) provided in the cylindrical form having a predetermined thickness and connected to the storage node contacts 240 of the semiconductor substrate 210 may be exposed. Also, the second etch stop layer 305 may be exposed.

Figure 11:
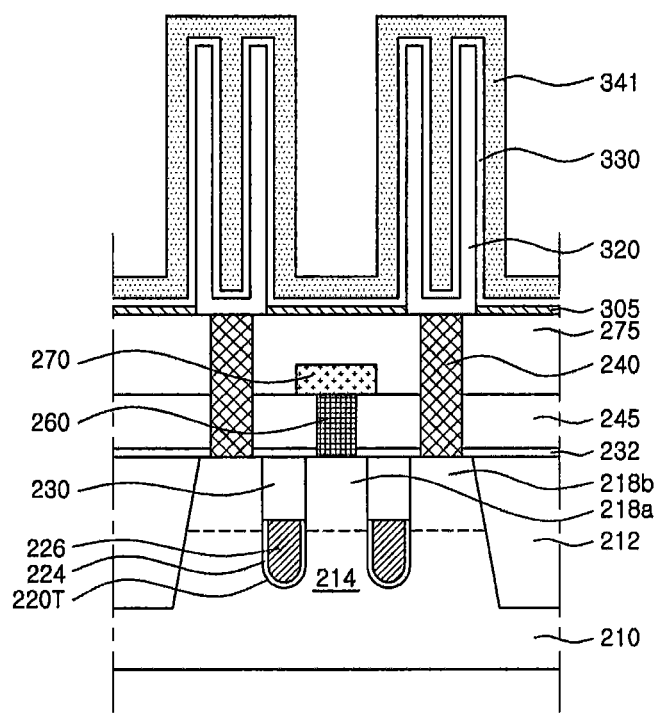

FIG. 11 is a cross-sectional view illustrating formation of a dielectric layer and a first upper electrode. Referring to FIG. 11, a dielectric layer 330 may be formed on an exposed surface of the lower electrode 320. The dielectric layer 330 may include a silicon oxide, a silicon nitride, silicon oxide/silicon nitride, silicon oxide/silicon nitride/silicon oxide, and/or a high dielectric material having a dielectric constant higher than a silicon oxide. For example, the high dielectric material may include $HfO_2$, $ZrO_2$, $Al_2O_3$, $TiO_2$, $Ta_2O_5$, $Nb_2O_5$, $SrTiO_3$, and/or the like. The dielectric layer 330 may include two or more layers formed of different materials among the aforementioned high dielectric materials. By way of example, the dielectric layer 330 may be formed of $Ta_2O_5/Nb_2O_5$, $ZrO_2/Al_2O_3/ZrO_2$, $HfO_2/Al_2O_3/HfO_2$, and/or the like. According to example embodiments of the present inventive concepts, the dielectric layer 330 may be formed of $ZrO_2/Al_2O_3/ZrO_2$ having a low leakage current density and a sufficiently low equivalent oxide thickness (EOT). The dielectric layer 330 may be formed by using a CVD process and/or an ALD process.

Subsequently to the forming of the dielectric layer 330, a first upper electrode 341 may be formed thereon. The first upper electrode 341 may be formed of a conductive material applied to the lower electrode. For example, the conductive material may include Ti, TiN, Ta, TaN, TiAlN, W, WN, Ru, $RuO_2$, Ir, $IrO_2$, Pt, and/or combinations thereof.

Figure 12:
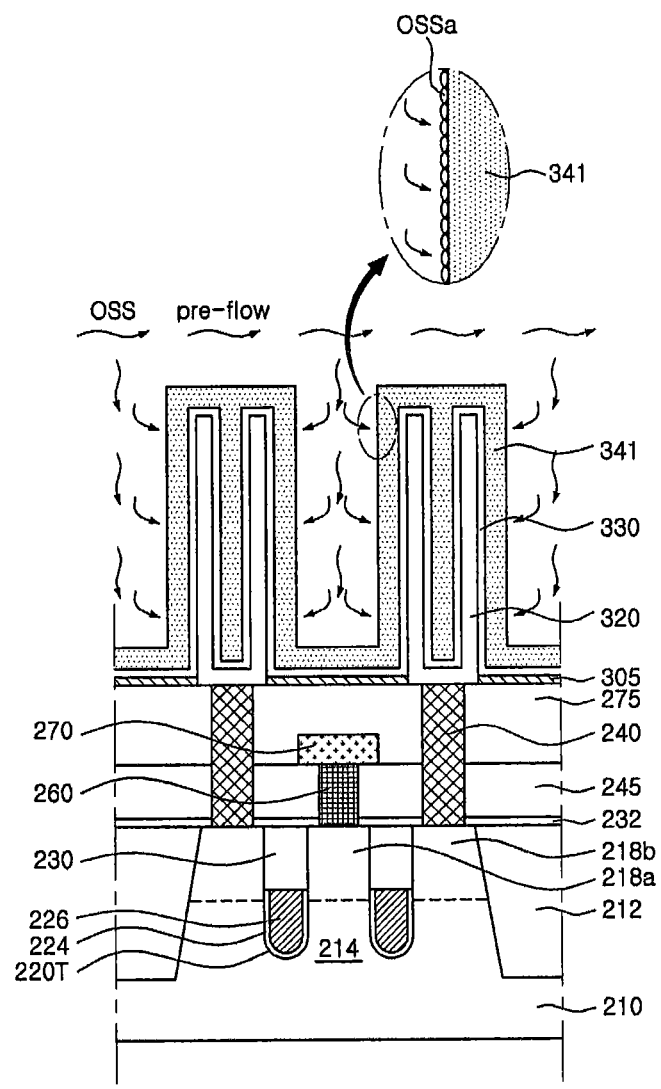

FIG. 12 is a cross-sectional view illustrating adsorption of an OSS onto a surface of a first upper electrode. As described above with reference to FIGS. 3 and 4, the OSS may be adsorbed onto the surface of the first upper electrode 341 by pre-flowing the OSS, prior to depositing a second upper electrode 345 on the first upper electrode 341. The adsorbed OSS layer OSSa may form a monolayer on the first upper electrode 341. However, the adsorbed OSS layer OSSa is not limited to a monolayer, and may instead form a multilayer on the entirety or on a portion of the surface of the first upper electrode 341. The pre-flow process of the OSS may be performed within a batch-type deposition apparatus, for example, an LPCVD apparatus. The OSS may be an aminosilane-based compound, for example, any of DEAS, DIPAS, BDEAS, BIPAS, BEMAS, TDMAS, TIPAS, and/or the like.

Figure 13:
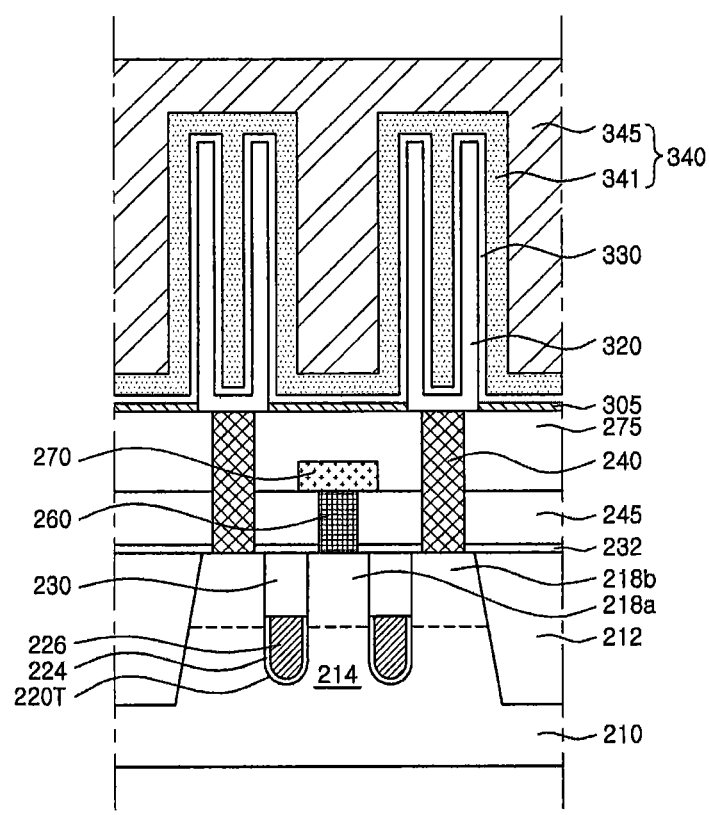

Referring to FIG. 13, the second upper electrode 345 may be formed on the first upper electrode 341, thereby completing an upper electrode 340. The forming of the second upper electrode 345 may be performed by using an LPCVD process within a batch-type deposition apparatus. The forming of the second upper electrode 345 may include forming a doped SiGe layer. After the adsorption of the OSS onto the surface of the first upper electrode 341, the forming of the second upper electrode 345 on the first electrode 341 onto which the OSS is adsorbed may be performed in-situ within the batch-type deposition apparatus.

The forming of the second upper electrode 345 may include forming a SiGe layer doped with p-type or n-type impurities by performing the LPCVD using a silicon source gas, a germanium source gas, and an impurity gas including boron (B) or phosphorous (P). The SiGe layer may be formed using an inorganic silicon source including $SiH_4$, or the like. In some embodiments of the present inventive concepts, the SiGe layer may be formed using the OSS used in the above-mentioned pre-flow process. Additionally, in some embodiments of the present inventive concepts, the forming of the SiGe layer may include forming a lower SiGe layer using an OSS and forming an upper SiGe layer using an inorganic silicon source.

The SiGe layer may be formed as the second upper electrode 345. The SiGe may be formed at a deposition temperature relatively lower than that of a silicon, for example, below 500 degrees, such that crystallization of the dielectric layer 330 below the second upper layer 345 may be prevented. In other words, the second upper electrode 345 may be formed at a temperature that is insufficient to result in crystallization of the previously-formed dielectric layer 330. Moreover, as described above with reference to FIGS. 6 and 7, the SiGe layer having a dense structure and a reproducible thickness may be formed independent or irrespective of a delay time after formation of the first upper electrode 341, by forming the second upper electrode 345 subsequently to the pre-flow process of the OSS. As such, the dielectric layer 330 and the upper electrode 340 including the first upper electrode 341 and the second upper electrode 345 may be sequentially formed on the lower electrode 320 to provide a capacitor connected to an impurity area of a transistor on the semiconductor substrate 210.

FIGS. 14 through 17 are cross-sectional views illustrating methods of manufacturing semiconductor devices according to some embodiments of the present inventive concepts, more particularly, methods of manufacturing semiconductor devices having concave-type capacitors.

Figure 14:
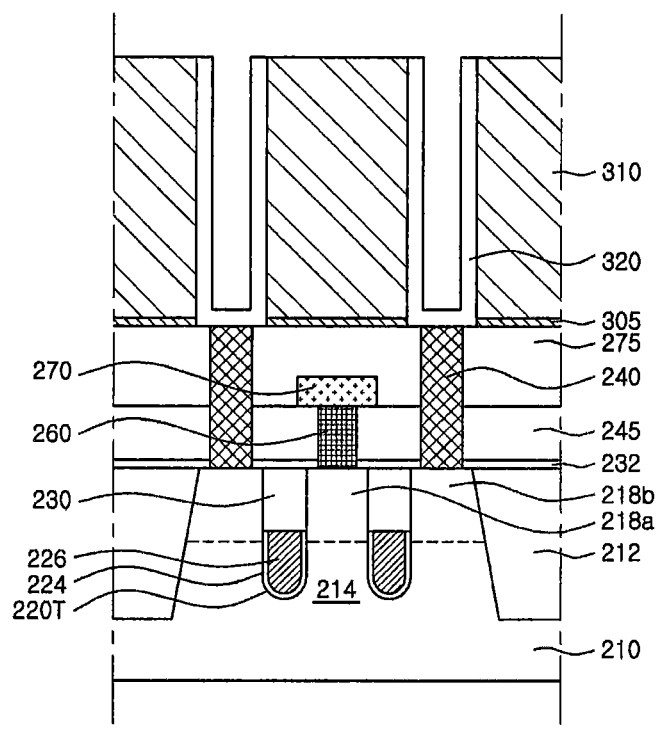
FIGS. 14 through 17 are cross-sectional views illustrating methods of manufacturing semiconductor devices according to some embodiments of the present inventive concepts.

FIG. 14 is a cross-sectional view illustrating formation of a lower electrode and storage node isolation. Referring to FIG. 14, the lower electrode 320 having a predetermined thickness may be continuously formed on the inner wall of the openings 312 and the top surface of the mold layer 310 described with reference to FIG. 8. The lower electrode 320 may physically contact and cover the storage node contacts 240, thus being electrically connected thereto. The lower electrode 320 may include Ti, TiN, Ta, TaN, W, WN, Ru, $RuO_2$, Ir, $IrO_2$, Pt, and/or combinations thereof.

A storage node isolation process may be performed on the lower electrode 320. The lower electrodes 320, having a cylindrical shape, may be formed to be separate from each other by removing portions of the lower electrode 320 formed on the top surface of the mold layer 310 by using a CMP process until the top surface of the mold layer 310 is exposed. Consequently, respective top surfaces of the mold layer 310, the lower electrode 320, and the sacrificial layer 325 may be coplanar or exposed to a common plane.

Figure 15:
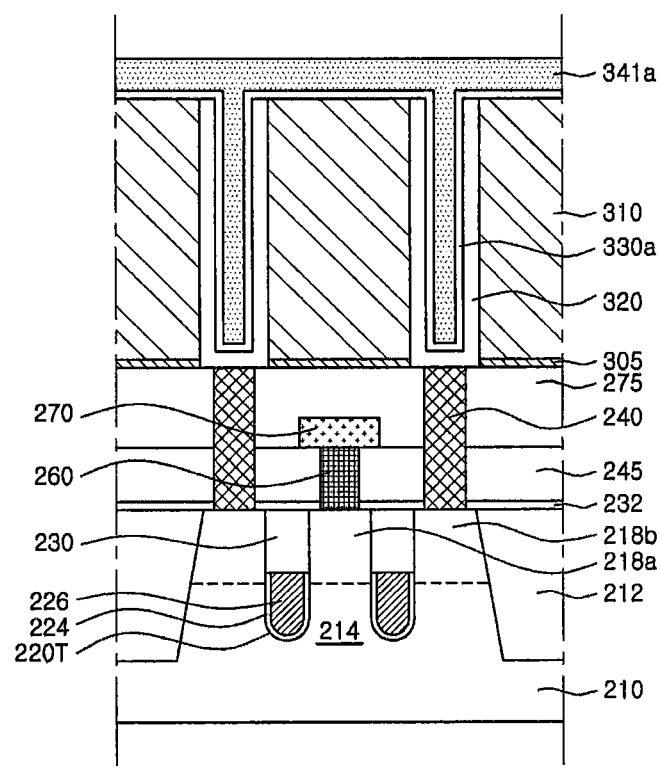

FIG. 15 is a cross-sectional view illustrating formation of a dielectric layer and a first upper electrode. Referring to FIG. 15, a dielectric layer 330a may be formed on the exposed surface of the lower electrode 320.

The dielectric layer 330a may include a silicon oxide, a silicon nitride, silicon oxide/silicon nitride, silicon oxide/silicon nitride/silicon oxide, and/or a high dielectric material having a dielectric constant higher than a silicon oxide. For example, the high dielectric material may include $HfO_2$, $ZrO_2$, $Al_2O_3$, $TiO_2$, $Ta_2O_5$, $Nb_2O_5$, $SrTiO_3$, and/or the like. The dielectric layer 330a may include two or more layers formed of different materials among the aforementioned high dielectric materials. By way of example, the dielectric layer 330a may be formed of $Ta_2O_5/Nb_2O_5$, $ZrO_2/Al_2O_3/ZrO_2$, $HfO_2/Al_2O_3/HfO_2$, or the like. According to example embodiments of the present inventive concepts, the dielectric layer 330a may be formed of $ZrO_2/Al_2O_3/ZrO_2$ having a relatively low leakage current density and a sufficiently low equivalent oxide thickness (EOT). The dielectric layer 330a may be formed by using a CVD process and/or an ALD process.

Subsequently to the forming of the dielectric layer 330a, a first upper electrode 341a may be formed thereon. The first upper electrode 341a may be formed of a conductive material applied to the lower electrode. For example, the conductive material may include Ti, TiN, Ta, TaN, TiAlN, W, WN, Ru, $RuO_2$, Ir, $IrO_2$, Pt, and/or combinations thereof.

Figure 16:
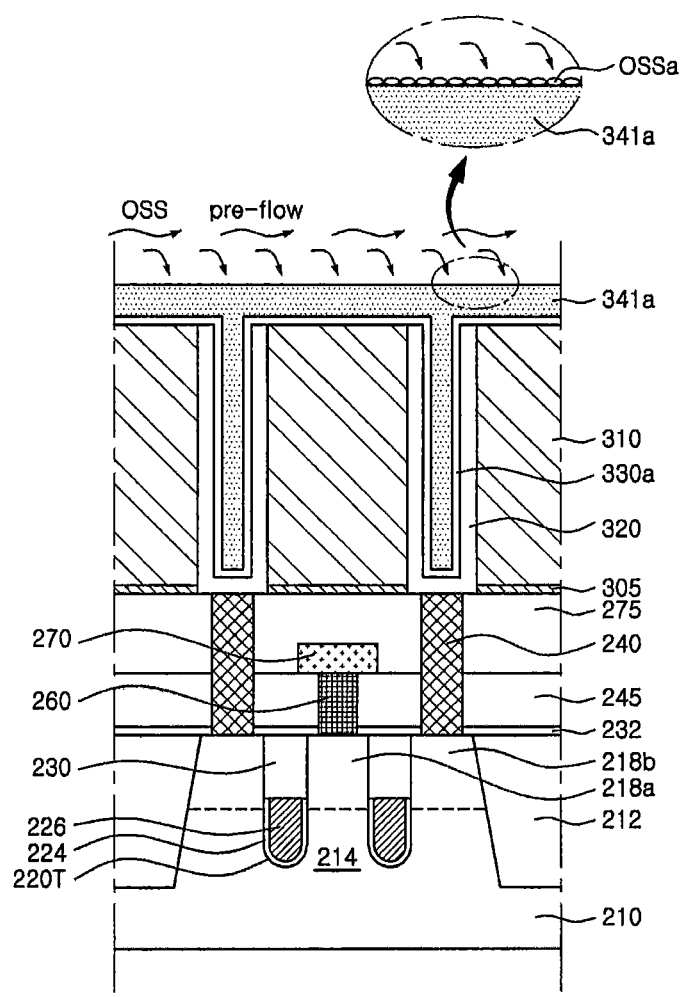

FIG. 16 is a cross-sectional view illustrating adsorption of an OSS onto a surface of a first upper electrode. Referring to FIG. 16, an OSS may be adsorbed onto a surface of the first upper electrode 341a by pre-flowing the OSS, prior to depositing a second upper electrode on the first upper electrode 341a. The adsorbed OSS layer OSSa may form a monolayer on the first upper electrode 341a. However, the adsorbed OSS layer OSSa is not limited to a monolayer, and may form a multilayer on up to the entirety or on a portion of the surface of the first upper electrode 341a. The pre-flow process of the OSS may be performed within a batch-type deposition apparatus, for example, an LPCVD apparatus. The OSS may be an aminosilane-based compound, for example, any of DEAS, DIPAS, BDEAS, BIPAS, BEMAS, TDMAS, TIPAS, and/or the like.

Figure 17:
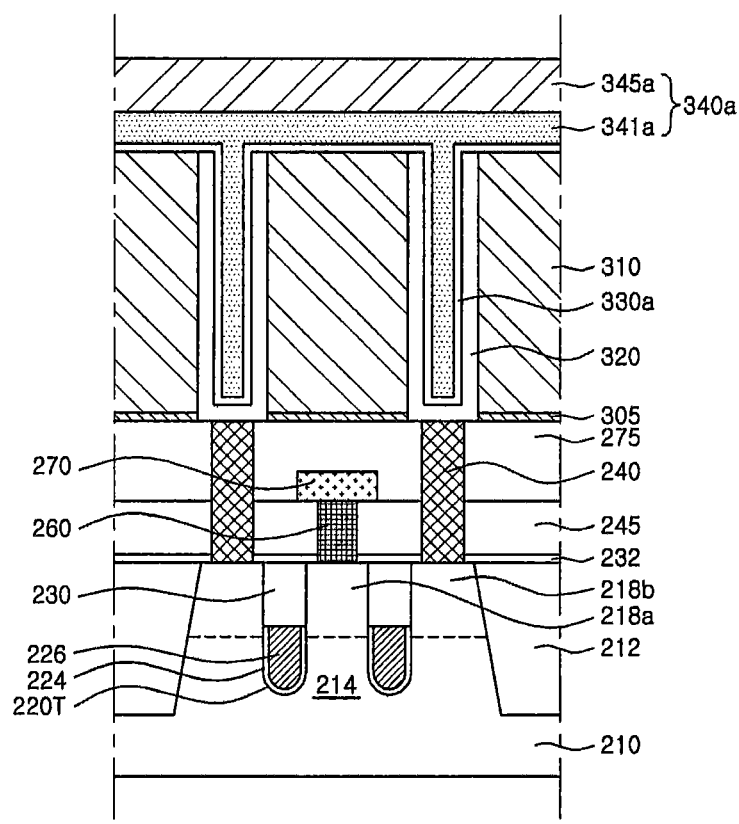

Referring to FIG. 17, a second upper electrode 345a may be formed on the first upper electrode 341a, thereby completing an upper electrode 340a. The forming of the second upper electrode 345a may be performed by using an LPCVD process within a batch-type deposition apparatus. The forming of the second upper electrode 345a may include forming a doped SiGe layer. After the adsorption of the OSS onto the surface of the first upper electrode 341a, the forming of the second upper electrode 345a on the first electrode 341b onto which the OSS is adsorbed may be performed in situ within the batch-type deposition apparatus.

The forming of the second upper electrode 345a may include forming a SiGe layer doped with p-type or n-type impurities by performing the LPCVD using a silicon source gas, a germanium source gas, and an impurity gas including B or P. The SiGe layer may be formed using an inorganic silicon source including $SiH_4$, or the like. In some embodiments of the present inventive concepts, the SiGe layer may be formed using the OSS used in the pre-flow process described above. Further, in some embodiments of the present inventive concepts, the forming of the SiGe layer may include forming a lower SiGe layer using an OSS and forming an upper SiGe layer using an inorganic silicon source.

FIGS. 18 through 22 are cross-sectional views illustrating methods of manufacturing semiconductor devices according to some embodiments of the present inventive concepts, more particularly, methods of manufacturing a semiconductor having pillar-type capacitor structures.

Figure 18:
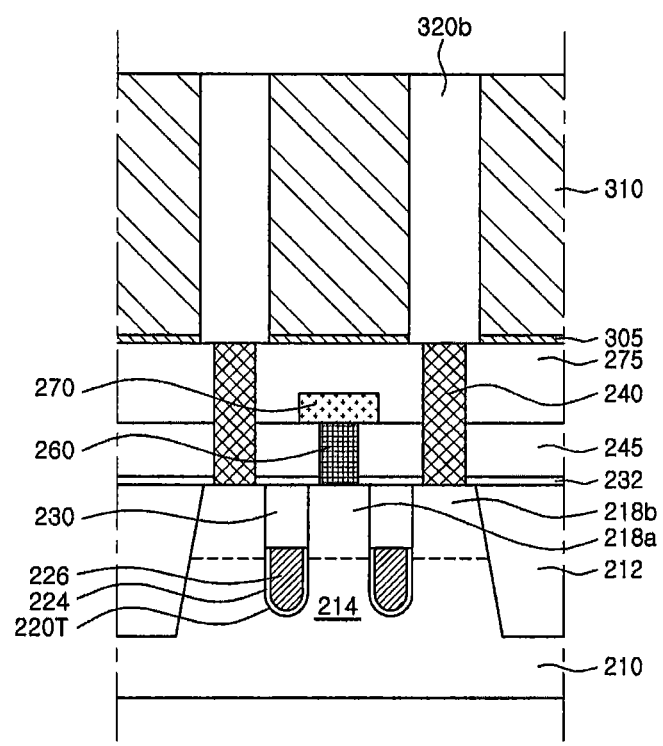
FIGS. 18 through 22 are cross-sectional views illustrating methods of manufacturing semiconductor devices according to some embodiments of the present inventive concepts.

FIG. 18 is a cross-sectional view illustrating formation of a lower electrode and storage node isolation. Referring to FIG. 18, a lower electrode 320b may be continuously formed to fill an interior of the openings described with reference to FIG. 8. The lower electrode 320b may physically contact and cover the storage node contacts 240, thus being electrically connected thereto. The lower electrode 320b may include Ti, TiN, Ta, TaN, W, WN, Ru, $RuO_2$, Ir, $IrO_2$, Pt, and/or combinations thereof.

A storage node isolation process may be performed on the lower electrode 320b. The lower electrodes 320b may be formed to be separated from each other by removing portions of the lower electrode 320b covering the top surface of the mold layer 310, using a CMP process until the top surface of the mold layer 310 is exposed. Accordingly, the top surface of the mold layer 310 and a top surface of the lower electrode 320b may be coplanar or exposed to a common plane.

Figure 19:
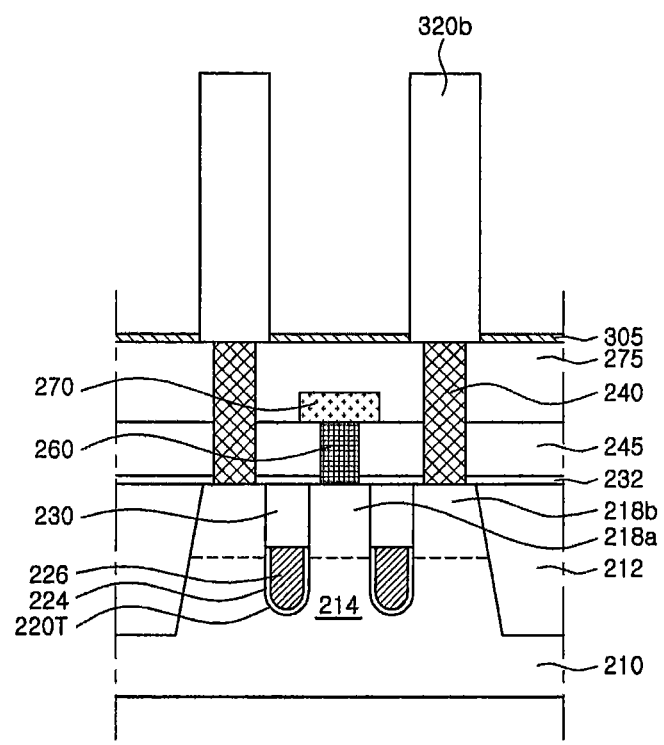

Referring to FIG. 19, the lower electrode 320b may be exposed by removing the mold layer 310. The process of removing the mold layer 310 may be performed by an isotropic etching process. As a result, the lower electrode 320b of a pillar-type connected to the storage node contacts 240 of the semiconductor substrate 210 may be exposed. The pillar-type lower electrode 320b may be provided in a form of a circular pillar, a rectangular pillar, or the like. Also, the second etch stop layer 305 may be exposed.

Figure 20:
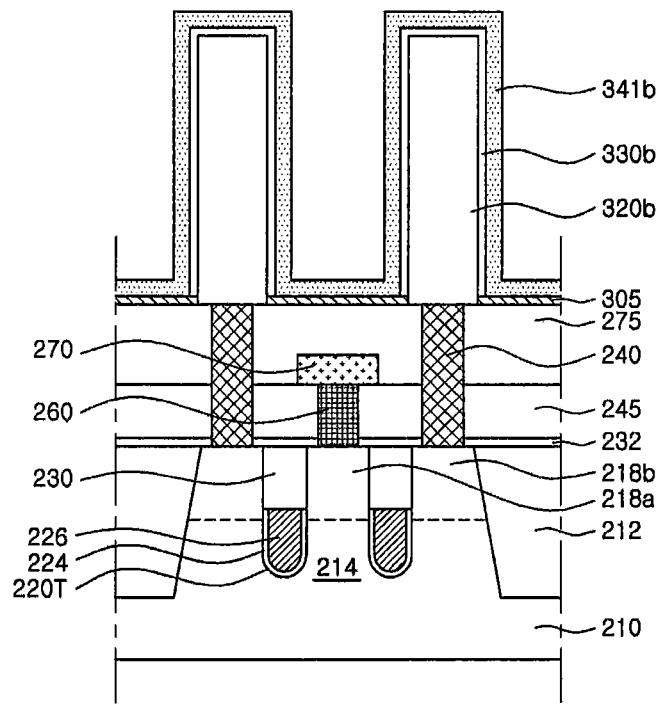

FIG. 20 is a cross-sectional view illustrating formation of a dielectric layer and a first upper electrode. Referring to FIG. 20, a dielectric layer 330b may be formed on the exposed surface of the lower electrode 320b.

The dielectric layer 330b may include a silicon oxide, a silicon nitride, silicon oxide/silicon nitride, silicon oxide/silicon nitride/silicon oxide, and/or a high dielectric material having a dielectric constant higher than a silicon oxide. For example, the high dielectric material may include at least one of $HfO_2$, $ZrO_2$, $Al_2O_3$, $TiO_2$, $Ta_2O_5$, $Nb_2O_5$, $SrTiO_3$, and/or the like. The dielectric layer 330b may include two or more layers of, different materials among the aforementioned high dielectric materials. By way of example, the dielectric layer 330b may be formed of $Ta_2O_5/Nb_2O_5$, $ZrO_2/Al_2O_3/ZrO_2$, $HfO_2/Al_2O_3/HfO_2$, and/or the like. According to example embodiments of the present inventive concepts, the dielectric layer 330b may be formed of $ZrO_2/Al_2O_3/ZrO_2$ having a relatively low leakage current density and a sufficiently low equivalent oxide thickness (EOT). The dielectric layer 330b may be formed by using a CVP process and/or an ALP process.

Subsequently to the forming of the dielectric layer 330b, a first upper electrode 341b may be formed thereon. The first upper electrode 341b may be formed of a conductive material applied to the lower electrode. For example, the conductive material may include Ti, TiN, Ta, TaN, TiAlN, W, WN, Ru, $RuO_2$, Ir, $IrO_2$, Pt, and/or combinations thereof.

Figure 21:
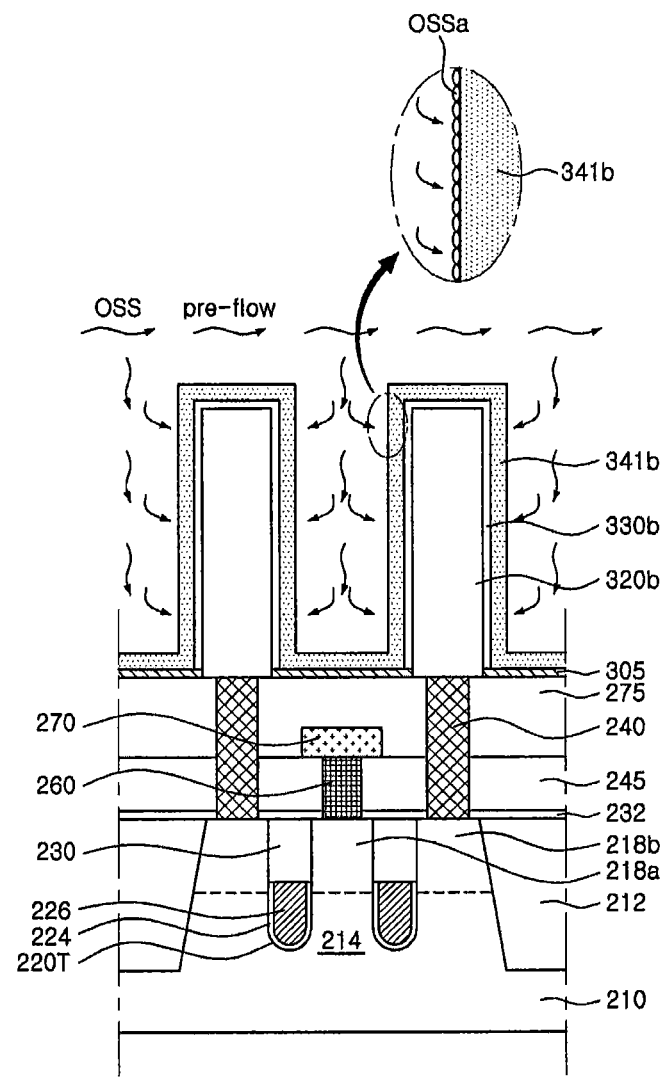

FIG. 21 is a cross-sectional view illustrating adsorption of an OSS onto a surface, of a first upper electrode. Referring to FIG. 21, an OSS may be adsorbed onto a surface of the first upper electrode 341b by pre-flowing the OSS, prior to forming a second upper electrode on the first upper electrode 341b. The adsorbed OSS layer OSSa may form a monolayer on the first upper electrode 341b. However, the adsorbed OSS layer OSSa is not limited to a monolayer, and may form a multilayer on the entirety or on a portion of the surface of the first upper electrode 341b. The pre-flow process of the OSS may be performed within a batch-type deposition apparatus, for example, an LPCVD apparatus. The OSS may be an aminosilane-based compound, for example, any of DEAS, DIPAS, BDEAS, BIPAS, BEMAS, TDMAS, TIPAS, and/or the like.

Figure 22:
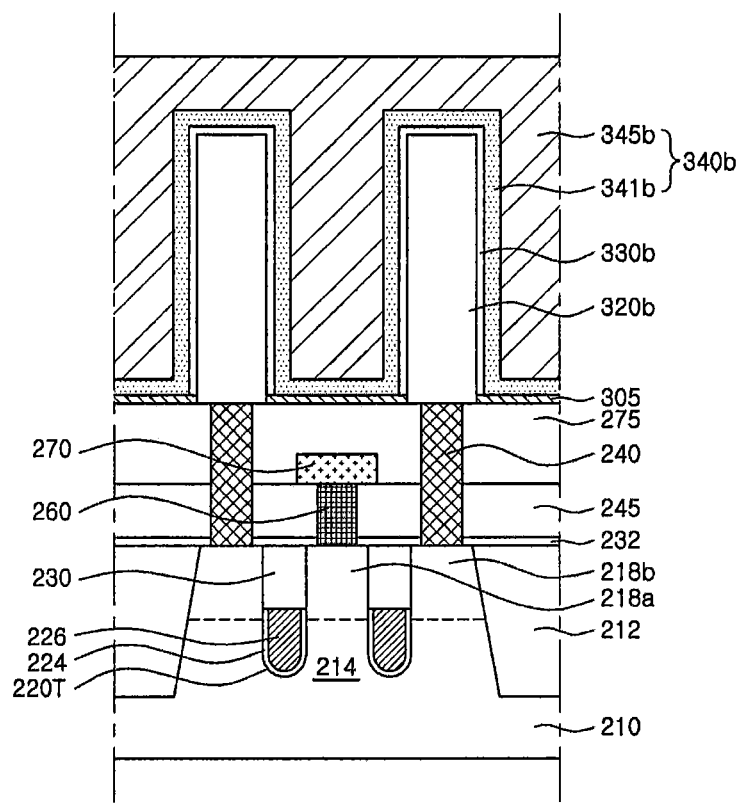

Referring to FIG. 22, a second upper electrode 345b may be formed on the first upper electrode 341b, thereby completing an upper electrode 340b. The forming of the second electrode 345b may be performed by using an LPCVD process within the batch-type deposition apparatus. The forming of the second upper electrode 345b may include forming a doped SiGe layer. After the adsorption of the OSS onto the surface of the first upper electrode 341b, the forming of the second upper electrode 345b on the first upper electrode 341b onto which the OSS is adsorbed may be performed in-situ within the batch-type deposition apparatus.

The forming of the second upper electrode 345b may include forming a SiGe layer doped with p-type or n-type impurities by performing the LPCVD process using a silicon source gas, a germanium source gas, and an impurity gas including B or P. The SiGe layer may be formed using an inorganic silicon source including $SiH_4$, or the like. In some embodiments of the present inventive concepts, the SiGe layer may be formed using the aforementioned OSS used in the pre-flow process. Further, in some embodiments of the present inventive concepts, the forming of the SiGe layer may include forming a lower SiGe layer using an OSS and forming an upper SiGe layer using an inorganic silicon source.

Figure 23:
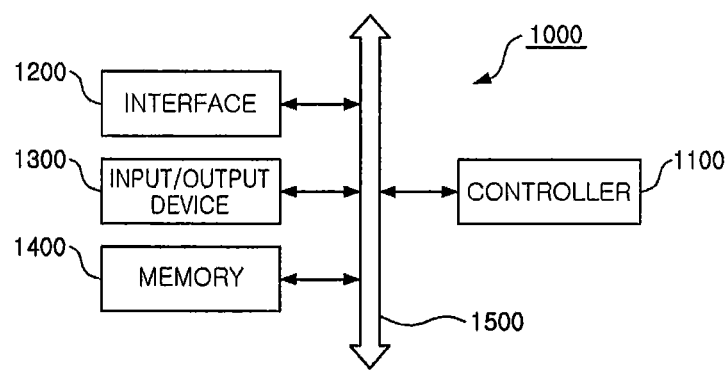
FIGS. 23 and 24 are respective block diagrams illustrating an electronic apparatus and a storage apparatus including semiconductor devices according to some embodiments of the present inventive concepts.
Figure 24:
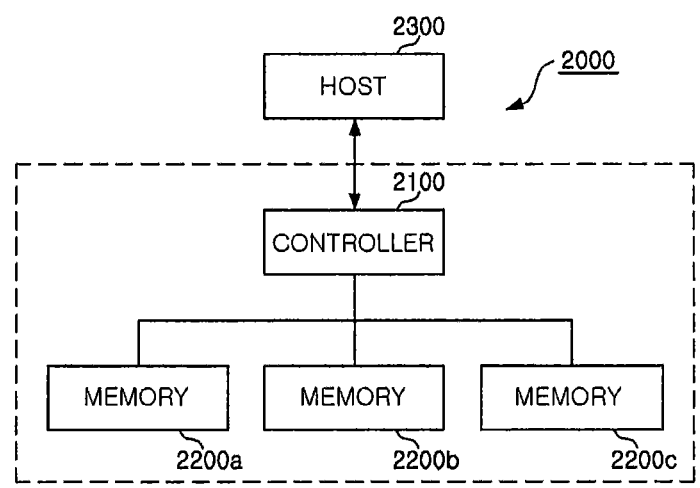

FIGS. 23 and 24 are block diagrams illustrating an electronic apparatus and a storage apparatus, respectively, including semiconductor devices according to some embodiments of the present inventive concepts.

Referring to FIG. 23, an electronic apparatus 1000 including the semiconductor devices according to some embodiments of the present inventive concepts may include a controller 1100, an interface 1200, an input/output device 1300, a memory 1400, and the like. The controller 1100, the interface 1200, the input/output device 1300, the memory 1400, and the like, may be connected through a bus 1500 providing a path by which data is transferred.

The controller 1100 may include, for example, a microprocessor, a digital signal processor, a micro controller, and/or the like. The memory 1400 may include a device for reading and writing data in various manners. The controller 1100 and the memory 1400 may include semiconductor devices 500A, 500B, and/or 500C according to the example embodiments of the present inventive concepts described in the foregoing.

The input/output device 1300 may include a keypad, a keyboard, a touch screen, a display, an audio input/output module, and/or the like. The interface 1200 may be a module for transmitting and/or receiving data to and/or from a communication network, and may include, for example, an antenna, a wired/wireless transceiver, and/or the like. Also, aside from the elements illustrated in FIG. 23, the electronic apparatus 1000 may further include such as an application chip set, an image capturing device, and/or the like. The electronic apparatus 1000 as illustrated in FIG. 23 may not be limited in terms of a category thereof, and may include various types of devices, such as a personal digital assistant (PDA), a portable computer, a mobile phone, a wireless phone, a laptop computer, a memory card, a portable media player, a tablet personal computer (PC), and/or the like.

Referring to FIG. 24, a storage apparatus 2000 including semiconductor devices according to some embodiments of the present inventive concepts may include a controller 2100 communicating with a host 2300, and memories 2200a, 2200b, and 2200c for storing data. The controller 2100 and/or one or more of the memories 2200a, 2200b, and 2200c may include the semiconductor devices 500A, 500B, and/or 500C according to the example embodiments of the present inventive concepts described in the foregoing.

The host 2300 communicating with the controller 2100 may include various types of electronic apparatus in which the storage apparatus 2000 is provided, for example, a smartphone, a digital camera, a desktop computer, a laptop computer, a media player, and/or the like. The controller 2100 may store data in the memories 2200a, 2200b, and/or 2200c by receiving a data writing request or a data reading request transferred from the host 2300, and/or may generate a command (CMD) for fetching data from the memories 2200a, 2200b, and/or 2200c.

As set forth above, according to example embodiments of the present disclosure, a thickness of a SiGe layer forming an upper electrode in an MIM capacitor structure may be formed in a uniform and reproducible manner by adsorbing an OSS prior to the forming of the SiGe layer.

While example embodiments have been shown and described above, it will be apparent to those skilled in the art that substitutions, modifications and variations could be made without departing from the scope of the present inventive concepts as defined by the appended claims.

What is claimed is:

1. A method of manufacturing a capacitor for a semiconductor device, the method comprising:
   forming a lower electrode;
   forming a dielectric layer on the lower electrode;
   forming a first upper electrode on the dielectric layer;
   adsorbing an organic silicon source onto a surface of the first upper electrode; and
   forming a second upper electrode on the first upper electrode onto which the organic silicon source is adsorbed.

2. The method of claim 1, wherein the adsorbing of the organic silicon source is performed by using a pre-flow process.

3. The method of claim 1, wherein the organic silicon source is an aminosilane-based compound.

4. The method of claim 3, wherein the aminosilane-based compound comprises diethylaminosilane (DEAS), diisopropylaminosilane (DIPAS), bis-diethylaminosilane (BDEAS), bis-isopropylaminosilane (BIPAS), bis-ethylmethylaminosilane (BEMAS), tris-dimethylaminosilane (TDMAS), or tris-isopropylaminosilane (TIPAS).

5. The method of claim 1, wherein the surface of the first upper electrode is rendered hydrophilic responsive to the adsorbing of the organic silicon source.

6. The method of claim 1, wherein prior to the adsorbing of the organic silicon source, oxygen atoms are bonded onto at least a portion of the surface of the first upper electrode.

7. The method of claim 1, wherein the forming of the second upper electrode comprises forming a silicon germanium (SiGe) layer doped with impurities.

8. The method of claim 7, wherein the SiGe layer is formed using an inorganic silicon source.

9. The method of claim 7, wherein the SiGe layer is formed using an organic silicon source.

10. The method of claim 7, wherein the forming of the SiGe layer comprises:
    forming a lower SiGe layer using an organic silicon source; and
    forming an upper SiGe layer using an inorganic silicon source.

11. The method of claim 7, wherein the impurities comprise boron (B) or phosphorus (P).

12. The method of claim 1, wherein the adsorbing of the organic silicon source and the forming of the second upper electrode are performed in-situ within a batch-type deposition apparatus.

13. The method of claim 1, wherein the first upper electrode comprises titanium nitride (TiN), titanium aluminum nitride (TiAlN), or tantalum nitride (TaN).

14. The method of claim 1, wherein the lower electrode has a cylindrical shape.

15. A method of manufacturing a capacitor for a semiconductor device, the method comprising:
    providing a semiconductor substrate having at least one transistor;
    forming a lower electrode in a cylindrical shape on the semiconductor substrate;
    forming a dielectric layer on the lower electrode;
    forming a first upper electrode on the dielectric layer;
    adsorbing an aminosilane-based silicon source onto a surface of the first upper electrode; and
    forming a second upper electrode on the surface of the first upper electrode.

16. A method of fabricating a metal-insulator-metal (MIM) capacitor, the method comprising:
    forming a capacitor lower electrode on a substrate;
    forming a capacitor dielectric layer on the lower electrode; and
    forming a multi-layer capacitor upper electrode on the dielectric layer opposite the capacitor lower electrode, the multi-layer capacitor upper electrode comprising first and second electrode layers and an organic silicon layer therebetween,
    wherein the forming the multi-layer capacitor upper electrode comprises:
    adsorbing an organic silicon source onto a surface of the first electrode layer to define the organic silicon layer thereon; and then
    forming the second electrode layer on the organic silicon layer.

17. The method of claim 16, wherein the surface of first electrode layer comprises portions that are hydrophobic prior to adsorbing the organic silicon source, and wherein the portions are hydrophilic responsive to adsorbing the organic silicon source.

18. The method of claim 16, wherein the second electrode layer comprises a silicon germanium layer having a thickness that is substantially uniform independent of a delay time between forming the first electrode layer and the forming of the second electrode layer thereafter.

19. The method of claim 18, wherein forming the second electrode layer comprises:
    forming the second electrode layer using an inorganic silicon source and/or the organic silicon source at a temperature that is insufficient to crystallize the capacitor dielectric layer, wherein the organic silicon source is an aminosilane-based compound, and wherein the inorganic silicon source comprises a silane-based compound.

20. The method of claim 15,
wherein the surface of first upper electrode comprises portions that are hydrophobic prior to adsorbing the aminosilane-based silicon source,
wherein the portions are hydrophilic responsive to adsorbing the aminosilane-based silicon source, and
wherein the second upper electrode comprises a silicon germanium layer having a thickness that is substantially uniform independent of a delay time between the forming of the first upper electrode and the forming of the second upper electrode thereafter.

* * * * *